(12) United States Patent
Zhu

(10) Patent No.: US 9,711,409 B2
(45) Date of Patent: Jul. 18, 2017

(54) FIN ARRANGEMENT AND METHOD FOR MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 0 days.

(21) Appl. No.: 14/409,527

(22) PCT Filed: Nov. 19, 2012

(86) PCT No.: PCT/CN2012/084812
§ 371 (c)(1),
(2) Date: Dec. 19, 2014

(87) PCT Pub. No.: WO2014/071649
PCT Pub. Date: May 15, 2014

(65) Prior Publication Data
US 2015/0200141 A1    Jul. 16, 2015

(30) Foreign Application Priority Data
Nov. 9, 2012 (CN) .......................... 2012 1 0447851

(51) Int. Cl.
*H01L 29/06* (2006.01)
*H01L 21/8234* (2006.01)
(Continued)

(52) U.S. Cl.
CPC .. *H01L 21/823431* (2013.01); *H01L 21/0223* (2013.01); *H01L 21/31055* (2013.01);
(Continued)

(58) Field of Classification Search
CPC ......... H01L 21/8234; H01L 21/823431; H01L 21/0223
See application file for complete search history.

(56) References Cited

U.S. PATENT DOCUMENTS 7,528,022 B2   5/2009   Ahn et al.
7,560,785 B2   7/2009   Yu et al.
(Continued)

FOREIGN PATENT DOCUMENTS

CN    101303975     *  9/2007  ....... H01L 29/66795
CN    101303975 A    11/2008
(Continued)

OTHER PUBLICATIONS

International Search Report issued in International Patent Application No. PCT/CN2012/084812, dated Jul. 25, 2013.
(Continued)

*Primary Examiner* — Tuan Nguyen
(74) *Attorney, Agent, or Firm* — Pillsbury Winthrop Shaw Pittman LLP

(57) ABSTRACT

A fin arrangement and a method for manufacturing the same are provided. An example method may include: patterning a substrate to form an initial fin on a selected area of the substrate; forming, on the substrate, a dielectric layer to substantially cover the initial fin, wherein a portion of the dielectric layer located on top of the initial fin has a thickness substantially less than that of a portion the dielectric layer located on the substrate; and etching the dielectric layer back to expose a portion of the initial fin, wherein the exposed portion of the initial fin is used as a fin.

10 Claims, 7 Drawing Sheets

(51) Int. Cl.
  *H01L 29/66*    (2006.01)
  *H01L 21/02*    (2006.01)
  *H01L 21/3105*  (2006.01)
  *H01L 21/311*   (2006.01)
  *H01L 27/088*   (2006.01)

(52) U.S. Cl.
  CPC .. *H01L 21/31111* (2013.01); *H01L 29/66795* (2013.01); *H01L 21/02252* (2013.01); *H01L 21/02255* (2013.01); *H01L 27/0886* (2013.01)

(56) References Cited

U.S. PATENT DOCUMENTS

| | | | |
|---|---|---|---|
| 8,889,500 B1 | 11/2014 | Kamineni et al. | |
| 2008/0265338 A1* | 10/2008 | Yu | H01L 29/66795 257/397 |
| 2011/0042748 A1 | 2/2011 | Anderson et al. | |
| 2011/0045648 A1* | 2/2011 | Knorr | H01L 21/76232 438/296 |
| 2011/0068431 A1* | 3/2011 | Knorr | H01L 21/76229 257/506 |
| 2011/0263094 A1* | 10/2011 | Lin | H01L 21/76232 438/425 |
| 2013/0092984 A1 | 4/2013 | Liu et al. | |
| 2013/0292805 A1 | 11/2013 | Cai et al. | |
| 2015/0132912 A1 | 5/2015 | Wann et al. | |

FOREIGN PATENT DOCUMENTS

| | | |
|---|---|---|
| CN | 101789395 A | 7/2010 |
| CN | 102024743 A | 4/2011 |
| CN | 102099902 A | 6/2011 |
| CN | 102456734   | 5/2012 |

OTHER PUBLICATIONS

Written Opinion of the International Searching Authority issued in International Patent Application No. PCT/CN2012/084812, dated Jul. 25, 2013.

Chinese Office Action dated Dec. 31, 2015 in corresponding Chinese Patent Application No. 201210447851.1.

Chinese Office Action dated Aug. 17, 2016 in corresponding Chinese Patent Application No. 201210447851.1.

* cited by examiner

FIN ARRANGEMENT AND METHOD FOR MANUFACTURING THE SAME

CROSS-REFERENCE TO RELATED APPLICATION(S)

This application is a U.S. national phase application of PCT Patent Application No. PCT/CN2012/084812, filed on Nov. 19, 2012, which claims priority to Chinese Application No. 201210447851.1, entitled "FIN ARRANGEMENT AND METHOD FOR MANUFACTURING THE SAME," filed on Nov. 9, 2012, which is incorporated herein by reference in its entirety.

TECHNICAL FIELD

The present disclosure relates to the semiconductor field, and in particular, to a fin arrangement and a method for manufacturing the same.

BACKGROUND

As planar semiconductor devices are scaling down continuously, short channel effects are becoming more and more prominent. Therefore, 3D semiconductor devices, such as FinFETs (Fin Field Effect Transistors), are proposed. In general, a FinFET includes a fin formed vertically on a substrate and a gate intersecting the fin. Therefore, a channel region is formed in the fin, and has a width mainly determined by the height of the fin. However, in integrated circuit manufacture, it is difficult to control the heights of fins formed on a wafer to be identical, resulting in performance inconsistency between devices across the wafer.

SUMMARY

The present disclosure aims to provide, among others, a fin arrangement and a method for manufacturing the same.

According to an aspect of the present disclosure, a method for manufacturing a fin arrangement is provided. In an example, this method may comprise: patterning a substrate to form an initial fin on a selected area of the substrate; forming on the substrate a dielectric layer to substantially cover the initial fin, wherein a portion of the dielectric layer located on top of the initial fin has a thickness substantially less than that of a portion of the dielectric layer located on the substrate; and etching the dielectric layer back to expose a portion of the initial fin, wherein the exposed portion of the initial fin is used as a fin.

According to another aspect of the present disclosure, a fin arrangement is provided. In an example, this fin arrangement may comprise: a substrate; a plurality of fins formed on the substrate by patterning the substrate; and a dielectric layer formed on the substrate and partially filling gaps between adjacent fins, wherein the fins have their respective top surfaces substantially flush with each other, and the dielectric layer has a substantially flat top surface.

BRIEF DESCRIPTION OF THE DRAWINGS

The above and other objects, features and advantages of the present disclosure will become apparent from following descriptions of embodiments of the present disclosure with reference to the attached drawings, in which.

DETAILED DESCRIPTION

Figure 1:
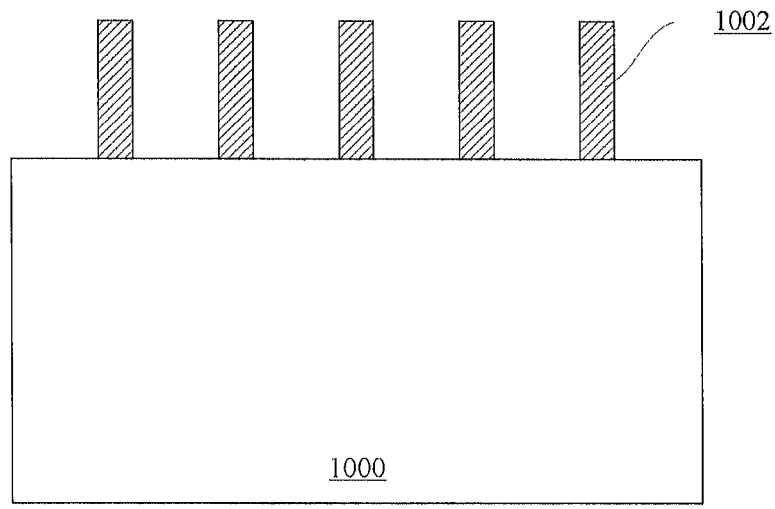
FIGS. 1-6 are schematic views illustrating a process for manufacturing a fin arrangement according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

A conventional way to control a height of a fin is to control parameters in a process of patterning the fin. For example, in a case where the fin is formed by etching a substrate, an etching depth and thus the height of the resultant fin can be controlled by etching parameters. In contrast, according to some embodiments of the present disclosure, the process of patterning the fin is not intentionally controlled in an accurate manner. Instead, after an initial fin is formed on a substrate by the patterning process, a dielectric layer may be formed on the substrate to substantially cover the initial fin. Subsequently, the dielectric layer may be etched back to expose a portion of the initial fin. In this way, the exposed portion of the initial fin can serve as a fin for a finished device, and has a height which is basically determined by a distance from its top surface to a top surface of the dielectric layer.

According to an embodiment of the present disclosure, the dielectric layer may be formed, such that when the dielectric layer substantially covers the initial fin (that is, in a case of multiple initial fins, gaps between the initial fins are filled substantially), a portion of the dielectric layer located on top of the initial fin has a thickness substantially or sufficiently less than that of a portion of the dielectric layer located on the substrate. For example, the thickness of the portion of the dielectric layer located on top of the initial fin may be less than one third (⅓), preferably one quarter (¼), of the thickness of the portion of the dielectric layer located on the substrate. This may be achieved, for example, by High Density Plasma (HDP) deposition. Furthermore, in a case where multiple initial fins are formed, a portion of the dielectric material located on a top surface of each of the initial fins may have a thickness less one half (½) of a spacing between this initial fin and a further initial fin adjacent thereto. In this way, in a subsequent process of etching back, an etching depth may be reduced, and thus it is possible to increase the accuracy in controlling the etching.

The technology disclosed herein may be presented in various ways, some of which will be described in the following by way of example.

First, with reference to FIGS. 1-6, a process for manufacturing a fin arrangement according to an embodiment of the present disclosure will be described.

As shown in FIG. 1, a substrate 1000 is provided. The substrate 1000 may comprise any suitable forms of substrates, for example, but not limited to, a bulk semiconductor substrate such as a bulk Si substrate, a Semiconductor on Insulator (SOI) substrate, a SiGe substrate, or the like. In the following description, the bulk Si substrate is described by way of example, for the purpose of simplicity.

Figure 2:
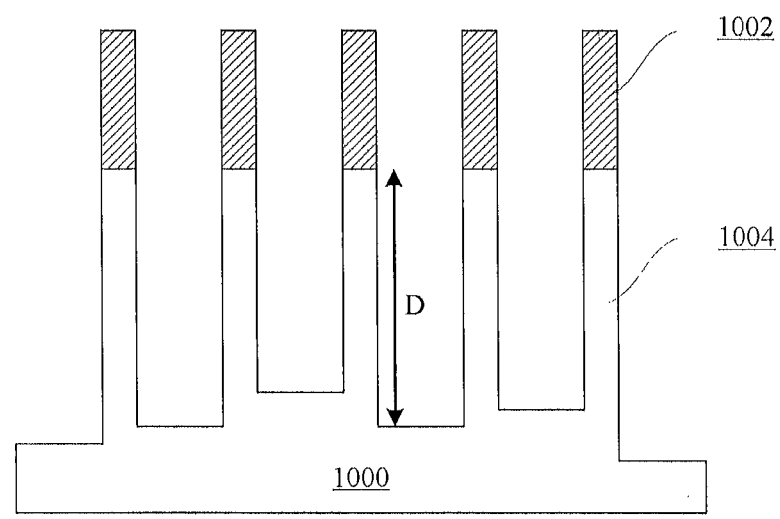

Initial fins may be formed by patterning the substrate 1000. There are various ways in the art to form the initial fins. For example, photoresist 1002 may be formed on the substrate 1000 and then patterned based on locations where the fins are to be formed. Subsequently, as shown in FIG. 2, with the patterned photoresist 1002 as a mask, the substrate 1000 may be patterned by, for example, Reactive Ion Etching (RIE), to form the initial fins 1004. After that, the photoresist 1002 may be removed. Because of a relatively great etching depth D, the etching depth actually varies significantly across the substrate. Such a variance is shown in FIG. 2.

It should be noted that although an example of 5 initial fins formed is shown in FIG. 2, the present disclosure is not limited thereto. More or less (or even one) initial fins may be formed.

Figure 3:
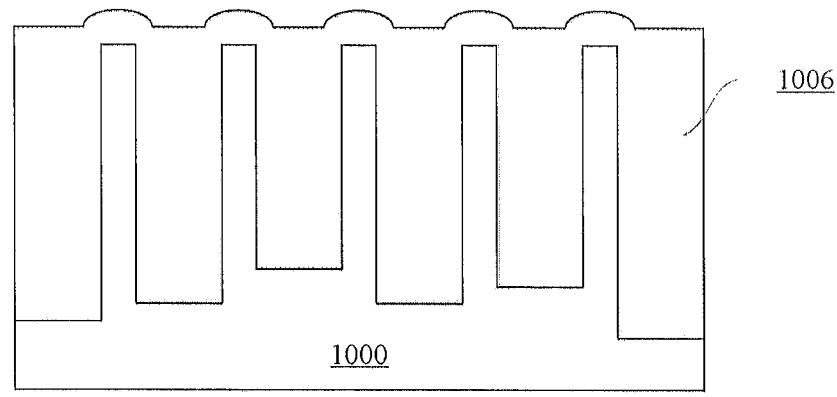

After that, as shown in FIG. 3, a dielectric layer 1006 may be formed by, for example, deposition, on the substrate 1000 having the initial fins formed thereon. According to an embodiment of the present disclosure, the deposition may be performed such that a portion of the dielectric layer located on top of the initial fins has a thickness substantially or sufficiently less than that of a portion of the dielectric layer located on the substrate. Typically, the thickness of the portion of the dielectric layer located on top of the initial fins may be less than one third (⅓), preferably, one quarter (¼), the thickness of the portion of the dielectric layer located on the substrate. For example, the thickness of the portion of dielectric layer located on top of each of the initial fins may be typically less than or equal to about 20 nm, and the thickness of the portion of the dielectric layer located on the substrate may be typically up to about 100 nm.

In an example, the dielectric layer 1006 may comprise oxide (for example, silicon oxide) formed by High Density Plasma (HDP) deposition. Due to characteristics of HDP during the deposition process, the thickness of the dielectric layer located on top of the initial fins (in a direction perpendicular to the substrate) and the thickness of the dielectric layer located on side walls of the initial fins (in a direction parallel to the substrate, i.e., a lateral direction) are less than the thickness of the dielectric layer located on the substrate between the initial fins (in the direction perpendicular to the substrate). Because of characteristics of HDP, the HDP deposition is usually not used for making oxide isolation in conventional processes.

Here, for example, deposition conditions may be controlled, such that when the dielectric layer 1006 substantially covers the initial fins 1004 (that is, substantially fills gaps between the initial fins 1004), a portion of the dielectric layer 1006 located on top of each of the initial fins 1004 may have a thickness less than one half (½) of a spacing between this initial fin 1004 and an initial fin adjacent thereto. If the spacing between the initial fins 1004 is not uniform, then the thickness of the portion of the dielectric layer 1006 on top of each of the initial fins 1004 may be selected to be less than one half (½) of a smaller one of the spacings between this initial fin 1004 and its adjacent initial fin.

Figure 4:
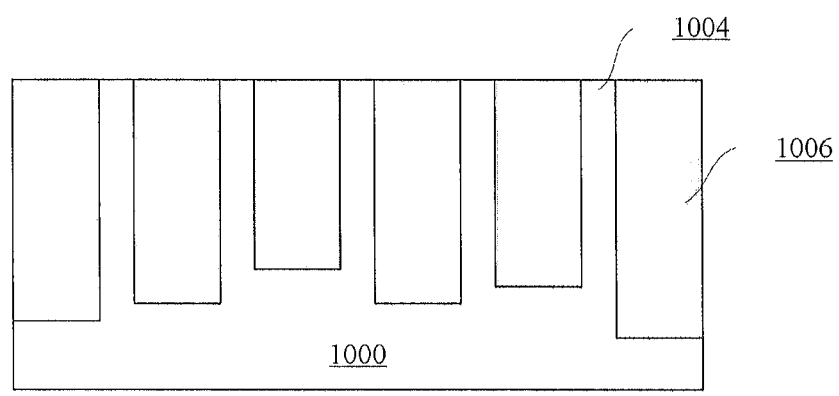
Figure 5:
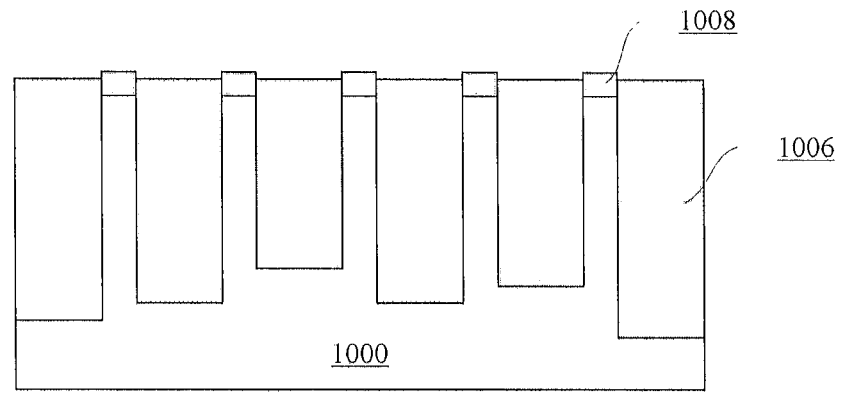
Figure 6:
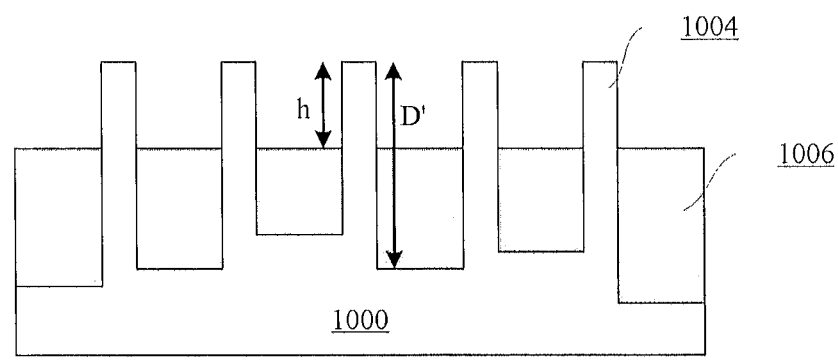

Subsequently, the dielectric layer 1006 may be etched back. According to an embodiment of the present disclosure, the etching back may be performed as follows. For example, as shown in FIG. 4, a planarization process, for example, Chemical Mechanical Polishing (CMP), may be performed on the dielectric layer 1006 until top surfaces of the initial fins 1004 are exposed. Preferably, after the top surfaces of the initial fins 1004 are exposed, a further planarization process (or an over-planarization process) may be performed, by which portions of the initial fins 1004 at their respective top ends are also removed. After that, the dielectric layer 1006 (for example, silicon oxide) may be selectively etched with respect to the substrate 1000 and the initial fins 1004 (for example, silicon). Preferably, before selectively etching the dielectric layer 1006, a thermal oxidation process may be performed as shown in FIG. 5, to form oxide 1008 at end portions of the initial fins 1004, so as to remove defects at the top ends of the initial fins 1004. By the selective etching, the dielectric layer 1006 is recessed with respect to the top surfaces of the initial fins 1004 to expose portions of the respective initial fins 1004, as shown in FIG. 6. The exposed portions of the initial fins 1004 are then used as fins for a finished device.

In a case where the dielectric layer 1006 comprises oxide, the oxide 1008 formed at the end portions of the initial fins 1004 will also be removed by the selective etching of the dielectric layer 1006. It is to be noted that the fins will function properly in the finished device even if the oxide 1008 is not removed.

Although the distance D' from the top surfaces of the initial fins 1004 to their bottom surfaces (D'<D due to the operations, such as the planarization process) varies significantly across the substrate as described above, the etching of the dielectric layer 1006 is relatively easy to control because the etching depth thereof is relatively shallow. As a result, it is possible to control a distance from the top surfaces of the fins 1004 to a top surface of the dielectric layer 1006 ("h", which at least partially determines a height of the fins in the finished device and therefore a channel width of the finished device) more accurately so that "h" is kept substantially uniform across the substrate.

In this way, an example fin arrangement according to this embodiment of the present disclosure is achieved. As shown in FIG. 6, the fin arrangement comprises the initial fins 1004 formed on the substrate 1000. Further, the dielectric layer 1006 is formed on the substrate. The top surface of the dielectric layer 1006 is lower than the top surfaces of the initial fins 1004, such that portions of the initial fins 1004 are exposed. The exposed portions of the initial fins 1004 are used as the fins for the finished device. In the fin arrangement, the top surfaces of the respective fins 1004 are substantially flush with each other, and top surfaces of portions of the dielectric layer filled in the gaps between fins are also substantially flush with each other, such that the heights of the respective fins (i.e., "h") are substantially identical. The fins 1004 may have a width of about 5-30 nm.

After such a fin arrangement is achieved, a semiconductor device may be further formed on this fin arrangement. There are various ways in the art to form a semiconductor on the fin arrangement. An example will be described below with reference to FIGS. 7 and 8.

Figure 7:
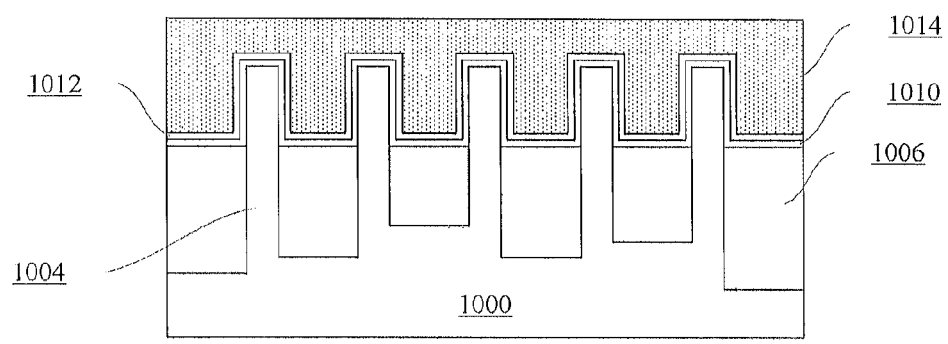
FIGS. 7 and 8 are schematic views showing a semiconductor device further formed on a fin arrangement according to an embodiment of the present disclosure.
Figure 8:
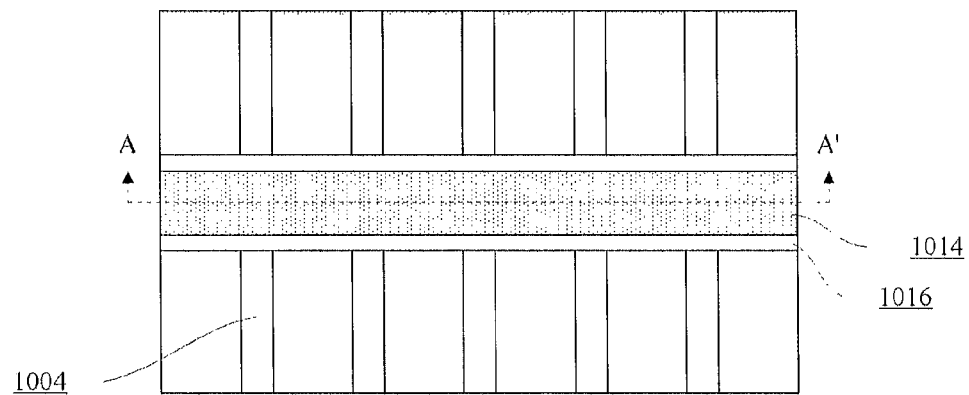

As shown in FIGS. 7 and 8 (FIG. 7 is a sectional view along line AA' of FIG. 8), a high-K gate dielectric layer 1010 may be formed on the fin arrangement by, for example, deposition. The high-K gate dielectric layer 1010 comprises $HfO_2$ with a thickness of about 2-5 nm, for example. Further, before the high-K gate dielectric layer 1010 is formed, a thin interface layer (not shown) may be deposited. The interface layer comprises oxide (for example, silicon oxide) with a thickness of about 0.3-0.7 nm, for example. On top of the high-K gate dielectric layer 1010, a gate conductor layer 1014 may be formed. The gate conductor layer 1014 comprises, for example, polycrystalline silicon. Further, a work function tuning layer 1012 may be formed between the high-K gate dielectric layer 1010 and the gate conductor layer 1014. For example, the work function tuning layer 1012 comprises TaC, TiN, TaTbN, TaErN, TaYbN, TaSiN, HfSiN, MoSiN, RuTa, NiTa, MoN, TiSiN, TiCN, TaAlC, TiAlN, TaN, PtSi, $Ni_3Si$, Pt, Ru, Ir, Mo, HfRu, $RuO_x$, or any combination thereof, with a thickness of about 2-10 nm.

As shown in FIG. 8, the gate conductor layer 1014 and the optional work function tuning layer 1012 may be patterned (into a strip shape in the embodiment of FIG. 8) to form a final gate stack. In the embodiment of FIG. 8, the high-K gate dielectric layer 1010 is also patterned to expose portions of the fins 1004. It should be noted that the patterning of the high-K gate dielectric layer 1010 is not necessary. On opposite sides of the gate stack, gate spacers 1016 may be further formed. The gate spacers 1016 comprise, for example, nitride (for example, silicon nitride). After the gate stack is formed as described above, source/drain implantation may be performed to form source/drain regions.

In the embodiment of FIG. 8, the gate stack is formed as a continuous strip. However, the present disclosure is not limited thereto. For example, gate stacks of different devices may be isolated from each other based on the design layout.

With reference to FIGS. 9-13, a process for manufacturing a fin arrangement according to an embodiment of the present disclosure is described below.

Figure 9:
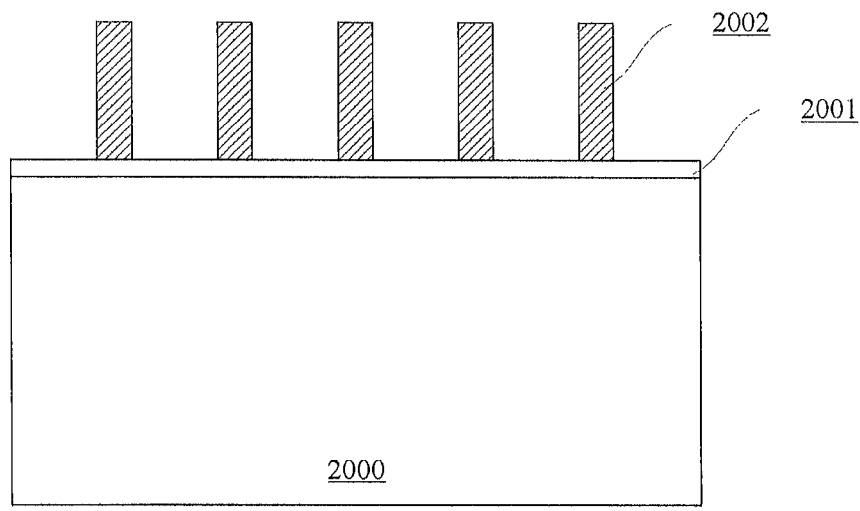
FIGS. 9-13 are schematic views illustrating a process for manufacturing a fin arrangement according to another embodiment of the present disclosure.

As shown in FIG. 9, a substrate 2000 is provided. The substrate 2000 may comprise any suitable forms of substrates, for example, but not limited to, a bulk semiconductor substrate, such as a bulk Si substrate, a Semiconductor on Insulator (SOI) substrate, a SiGe substrate, or the like. In the following description, the bulk Si substrate is described by way of example, for the purpose of simplicity. On the substrate 2000, a stop layer 2001 is formed by, for example, deposition. The stop layer 2001 may comprise nitride (for example, silicon nitride) with a thickness of about 10-20 nm, for example.

Figure 10:
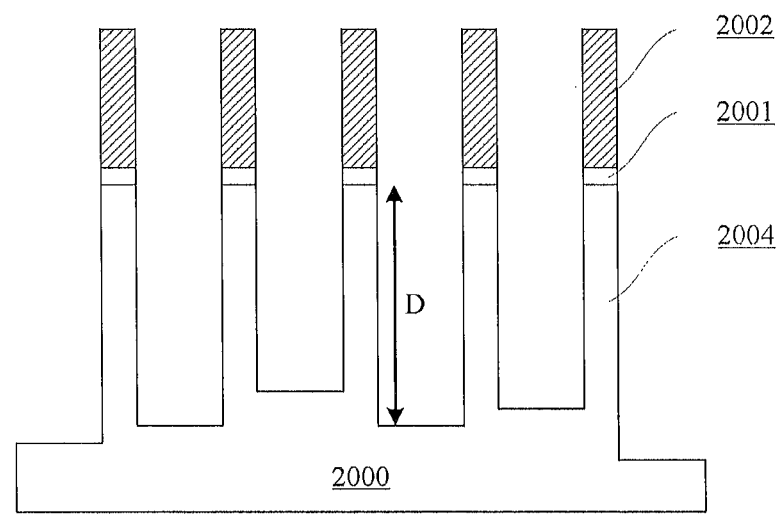

Subsequently, initial fins may be formed by patterning the substrate 2000. For example, photoresist 2002 may be formed on the stop layer 2001 and then patterned based on locations where the fins are to be formed. After that, as shown in FIG. 10, with the patterned photoresist 2002 as a mask, the stop layer 2001 and the substrate 2002 may be etched sequentially by, for example, RIE to form the initial fins 2004. Next, the photoresist 2002 may be removed. Because of a relatively great etching depth D, the etching depth actually varies significantly across the substrate.

Figure 11:
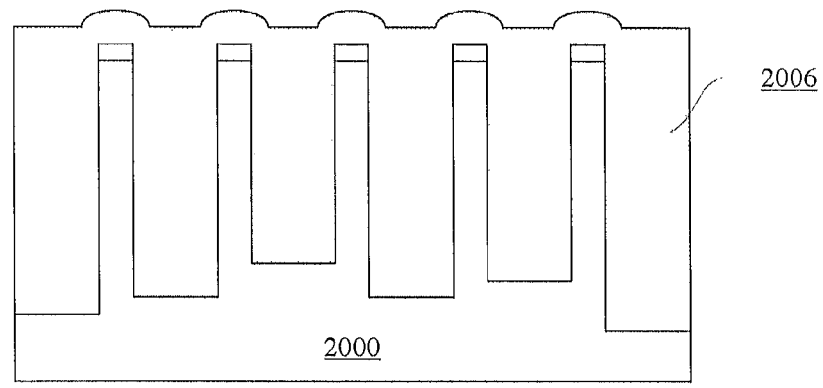

After that, as shown in FIG. 11, a dielectric layer 2006 may be formed by, for example, deposition on the substrate 2000 having the initial fins formed thereon. With regard to the dielectric layer 2006 and its formation, reference may be made to the above descriptions with reference to FIG. 3, and thus detailed descriptions thereof will be omitted here for simplicity.

Figure 12:
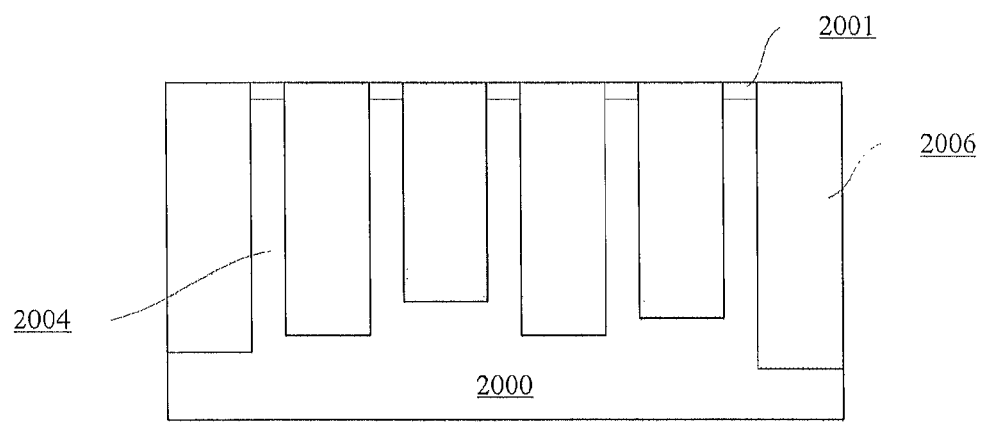
Figure 13:
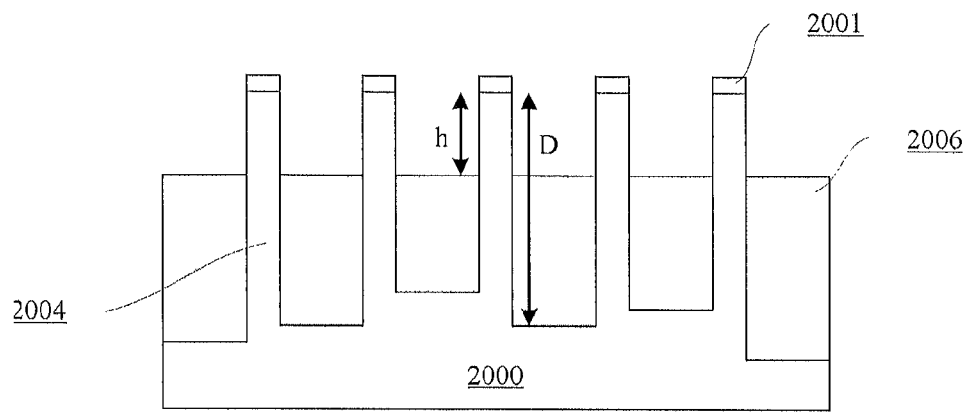

Subsequently, the dielectric layer 2006 may be etched back. For example, as shown in FIG. 12, a planarization process, such as CMP, may be performed on the dielectric layer 2006. The planarization process may stop at the stop layer 2001. After that, as shown in FIG. 13, the dielectric layer 2006 (for example, silicon oxide) may be selectively etched with respect to the substrate 2000 and the initial fins 2004 (for example, silicon) and also the stop layer 2001 (for example, silicon nitride). Due to the selective etching, the dielectric layer 2006 is recessed with respect to top surfaces of the initial fins 2004 to expose portions of the initial fins 2004. The exposed portions of the initial fins 2004 may then be used as fins for a finished device.

Although the distance D from the top surfaces of the fins 2004 to their bottom surfaces varies significantly across the substrate as described above, the etching of the dielectric layer 2006 is relatively easy to control because the etching depth thereof is relatively shallow. As a result, it is possible to control a distance from the top surfaces of the fins 2004 to a top surface of the dielectric layer 2006 ("h", which at least partially determines a height of the fins in the finished device and therefore a channel width of the finished device) more accurately so that "h" is kept substantially uniform across the substrate.

Figure 14:
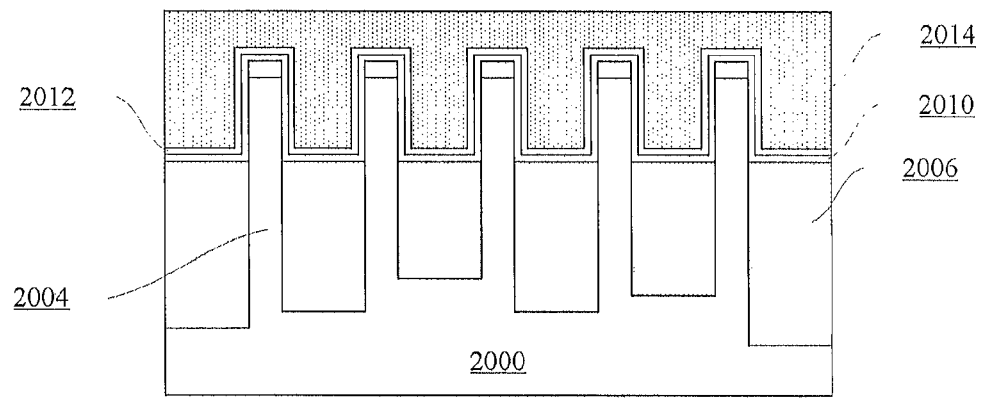
FIG. 14 is a schematic view showing a semiconductor device further formed on a fin arrangement according to another embodiment of the present disclosure.

Subsequently, as shown in FIG. 14, a semiconductor device may be formed on the fin arrangement shown in FIG. 13. For example, a high-K gate dielectric layer 2010, a work function tuning layer 2012, and a gate conductor layer 2014 may be formed sequentially by, for example, deposition on the fin arrangement, and then patterned to form a gate stack. With regard to the high-K gate dielectric layer 2010, the work function tuning layer 2012, and the gate conductor layer 2014 and also the formation thereof, reference may be made to the above descriptions with reference to FIGS. 7 and 8, and thus detailed descriptions thereof are omitted here for simplicity.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A method for manufacturing a fin arrangement, the method comprising:
   patterning a substrate to form a plurality of initial fins on a selected area of the substrate, wherein each of the plurality of initial fins has a width of about 5-30 nm;
   forming, on the substrate, a dielectric layer in such a manner that a portion of the dielectric layer in gaps between the plurality of initial fins on the substrate has a first thickness greater than a height of the plurality of initial fins, to substantially fill up the gaps and directly cover the plurality of initial fins, wherein a portion of the dielectric layer located on top of the plurality of initial fins has a second thickness substantially less than the first thickness;

performing a planarization process on the dielectric layer to expose a top surface of each of the plurality of initial fins; and selectively etching the dielectric layer to expose a portion of each of the plurality of initial fins, wherein the exposed portion of each of the plurality of initial fins is used as a fin, and wherein portions of the substrate between adjacent initial fins of the plurality of initial fins have a surface level that is varied across the substrate, the plurality of initial fins have their respective top surfaces substantially flush with each other, and the dielectric layer has a substantially flat top surface after the selective etching.

2. The method of claim 1, wherein the forming comprises High Density Plasma (HDP) deposition.

3. The method of claim 1, wherein a portion of the dielectric layer located on top of a first initial fin of the plurality of initial fins has a thickness less than one half of a spacing between the first initial fin and a second initial fin of the plurality of initial fins, the second initial fin being adjacent to the first initial fin.

4. The method of claim 1, wherein the second thickness is less than one third of the first thickness.

5. The method of claim 1, further comprising performing a further planarization process after the top surface of each of the plurality of initial fins is exposed in the planarization process.

6. The method of claim 5, further comprising, after the further planarization process, performing thermal oxidization on an end portion of each of the plurality of initial fins exposed by the further planarization process.

7. The method of claim 5, wherein the further planarization process is performed before the selective etching and removes at least a portion of one or more initial fins of the plurality of initial fins.

8. The method of claim 1, further comprising, before patterning the substrate, forming a stop layer on the substrate, wherein the planarization process of the dielectric layer is stopped at the stop layer.

9. The method of claim 1, wherein the dielectric layer comprises oxide.

10. The method of claim 1, wherein after the selective etching of the dielectric layer, a plurality of fins have their respective top surfaces substantially flush with each other, and the dielectric layer has a substantially flat top surface.

* * * * *